United States Patent
Stahl

(10) Patent No.: US 6,814,592 B1
(45) Date of Patent: Nov. 9, 2004

(54) SHORT CONTACT ELEMENT BETWEEN HOUSING PARTS

(75) Inventor: Hermann Stahl, Steinheim-Kleinbottwar (DE)

(73) Assignee: Hermann Stahl GmbH, Grossbottwar (DE)

( * ) Notice: Subject to any disclaimer, the term of this patent is extended or adjusted under 35 U.S.C. 154(b) by 0 days.

(21) Appl. No.: 10/148,096

(22) PCT Filed: Nov. 25, 1999

(86) PCT No.: PCT/EP99/09130

§ 371 (c)(1),
(2), (4) Date: May 23, 2002

(87) PCT Pub. No.: WO01/39331

PCT Pub. Date: May 31, 2001

(51) Int. Cl.$^7$ .............................................. H01R 13/648
(52) U.S. Cl. ...................... 439/108; 439/862; 439/609; 174/35 GC
(58) Field of Search ................................ 439/108, 607, 439/608, 609, 862; 174/35 GC, 35 R

(56) References Cited

U.S. PATENT DOCUMENTS

| | | | | |
|---|---|---|---|---|
| 5,353,201 A | * | 10/1994 | Maeda | 361/816 |
| 5,478,260 A | * | 12/1995 | Kaufman et al. | 439/609 |
| 5,527,192 A | * | 6/1996 | Juret | 439/862 |
| 5,909,865 A | * | 6/1999 | Stahl | 248/346.03 |
| 6,120,304 A | * | 9/2000 | Harwood et al. | 439/92 |
| 6,390,320 B2 | * | 5/2002 | Hurst et al. | 220/241 |
| 6,416,359 B1 | * | 7/2002 | Zhang et al. | 439/607 |
| 6,485,314 B1 | * | 11/2002 | Stahl | 439/108 |

* cited by examiner

*Primary Examiner*—P. Austin Bradley
*Assistant Examiner*—X. Chung-Trans
(74) *Attorney, Agent, or Firm*—Gudrun E. Huckett

(57) ABSTRACT

A springy contact element for contacting first and second housing parts has a sheet metal tab formed as a unitary part of the sheet metal of the first housing part. The sheet metal tab has a base adjoining a sheet metal edge and a contact surface spaced from the base. The contact surface rests electrically conductingly against the second housing part. The sheet metal tab has a longitudinal center axis extending from the base to the contact surface. The sheet metal tab has a cold-formed section having a thickness reduced by cold forming relative to a thickness of the sheet metal. The base is wider than a width of the sheet metal tab in the area from the base to the contact surface, wherein the width is measured transversely to the longitudinal center axis. The cold-formed section extends past the base and the sheet metal edge into the sheet metal.

17 Claims, 4 Drawing Sheets

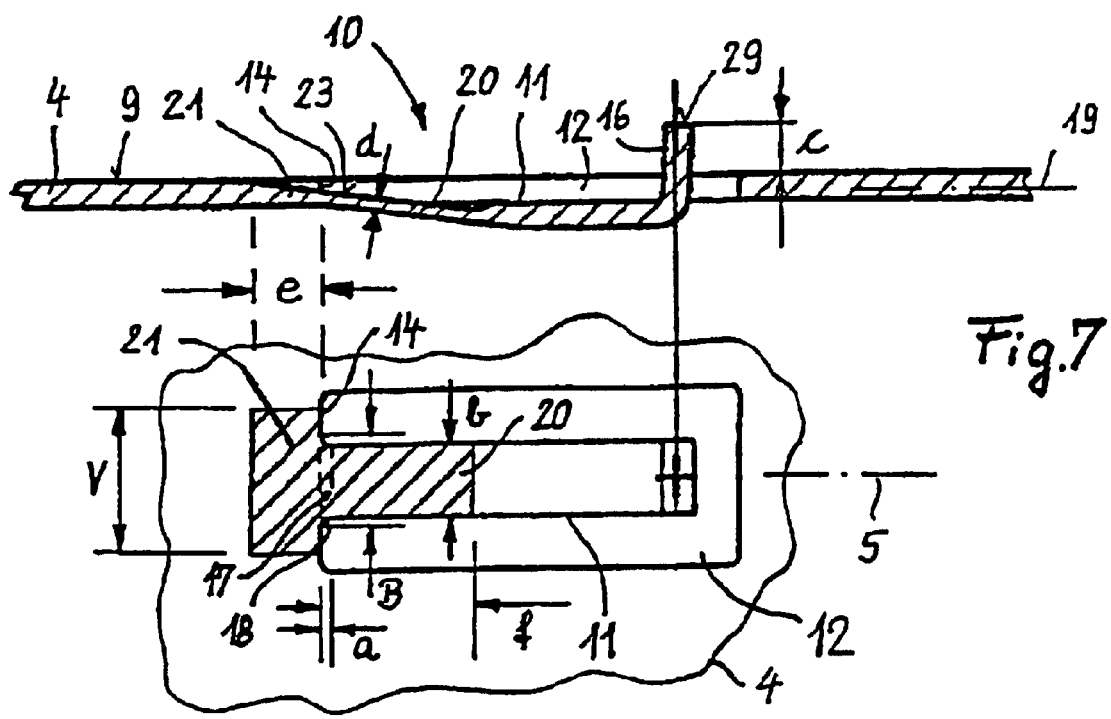
Fig. 7
Fig. 8
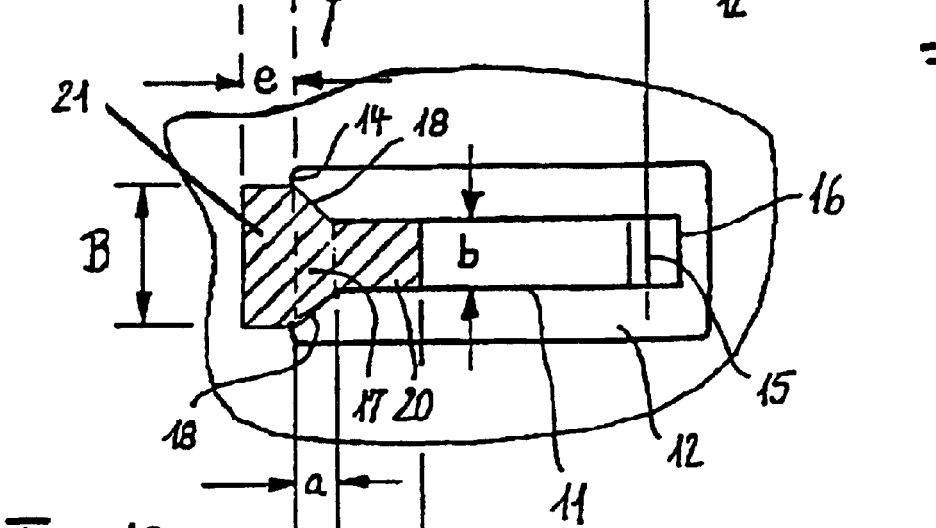
Fig. 9
Fig. 10

SHORT CONTACT ELEMENT BETWEEN HOUSING PARTS

BACKGROUND OF THE INVENTION

1. Field of the Invention

The invention relates to a contact element between housing parts, wherein at least one of the housing parts is formed of a sheet metal and a sheet metal tab, formed as a unitary part of this sheet metal, forms the springy contact element, wherein the sheet metal tab with its base adjoins a sheet metal edge and rests electrically conductingly against the other housing part by means of a contact surface positioned at a spacing to the base, wherein the sheet metal tab is reduced in its thickness in a section between the sheet metal edge and the contact surface relative to the thickness of the sheet metal by cold forming.

2. Description of the Related Art

Such a contact element is known from DE 195 07 846 C1 and has excellent spring properties which ensure a safe electrical contacting between the housing parts for obtaining electromagnetic shielding. Such contact elements can be formed during the manufacture of the housing parts without great manufacturing expenditure.

In order to ensure a sufficient spring travel without permanent deformation of the contact elements, they must have a corresponding length. A correspondingly matched large rectangular cutout or notch must be provided within the sheet metal into which—viewed from the narrow side— the sheet metal tab projects. By means of cold forming, the deep-drawable sheet metal in the area of the sheet metal tab is reduced in its thickness so that the sheet metal tab has spring properties. For correspondingly long sheet metal tabs sufficient spring travel is ensured which ensures a safe contacting even after several mounting and demounting operations of the housing parts.

Modern housings are becoming smaller and smaller. The continuing miniaturization enables extremely flat built-in parts. The housing sidewalls therefore are very narrow so that problems result in regard to providing contact elements in the area of the housing sidewalls. Large window-shaped cutouts for providing the required spring lengths weaken the housing sidewalls; sheet metal tabs which are too short have only minimal spring properties and have the tendency to be permanently deformed so that after several mounting and demounting operations of a housing a safe electrical contacting is no longer ensured.

It is an object of the invention to develop a contact element of the aforementioned kind such that a weakening of the housing sidewalls is substantially prevented while providing sufficient spring properties.

SUMMARY OF THE INVENTION

This object is solved according to the invention in that the base, at least at the level of the sheet metal edge, is wider than the width of the sheet metal tab itself measured in the transverse direction, and in that the cold-formed section extends past the base and the sheet metal edge into the sheet metal itself.

The base of the sheet metal tab, with which it adjoins the edge of the cutout, is configured to be wider than the sheet metal tab itself wherein the cold-formed section projects past the base and the sheet metal edge into the sheet metal itself so that a continuous transition of the cold-formed section out of the sheet metal into the sheet metal tab is provided. The constructive extension of the deformation section past the base into the sheet metal also enables, even for short sheet metal tabs, great spring properties without this resulting in the risk of a permanent deformation because of spring travel that is too great. The configuration of the deformed section so as to extend into the sheet metal thus enables short free lengths of the sheet metal tabs; correspondingly, the cutouts, in which the sheet metal tabs are positioned, can be made very short in the longitudinal direction of the sheet metal tabs.

While, for example, according to DE 195 07 846 C1, sheet metal tabs of a minimum of 15 to 16 mm are required in order to provide satisfactory spring properties, sheet metal tabs can be manufactured according to the invention with a minimal length of approximately 8 mm and sufficient spring properties. When optimizing the constructive configuration, minimal lengths of 5 to 6 mm are possible so that the required window-like cutouts can be kept very small. In this way, a weakening of the housing sidewalls is prevented as much as possible.

Preferably, the sheet metal tab adjoins the sheet metal edge via a base section which widens in the direction toward the sheet metal edge so that in this area a sufficient amount of material is available which is provided with spring properties by cold forming and ensures the required spring elasticity of the contact element. Preferably, for this purpose the base section has approximately a basic shape of a trapezoid in a plan view, wherein the larger one of the base sides of such a basic shape of a trapezoid is positioned at the level of the sheet metal edge.

For obtaining a sufficient spring elasticity, the base section is deformed about its entire width; in this connection, the end section of the deformation section tapering off within the sheet metal can be deformed or shaped with the same width as the base; preferably, the end section of the deformation section in the sheet metal is configured to be wider than the base.

The end section of the deformation section tapering off within the sheet metal has expediently an extension measured in the direction of the longitudinal center axis of the sheet metal tab, which extension is approximately 20 to 50%, in particular, 35%, of the free length of the deformation section.

BRIEF DESCRIPTION OF THE DRAWINGS

Further features of the invention can be taken from the additional claims, the description, and the drawing in which embodiments are illustrated which will be explained in detail in the following. It is shown in:

FIG. 7 a section of a further embodiment of a contact element in an illustration according to FIG. 5;

FIG. 8 a plan view onto the contact element according to FIG. 7;

FIG. 9 a section view of another embodiment of the contact element according to the invention in an illustration according to FIG. 5;

FIG. 10 a plan view onto the contact element according to FIG. 9.

DESCRIPTION OF PREFERRED EMBODIMENTS

Figure 1:
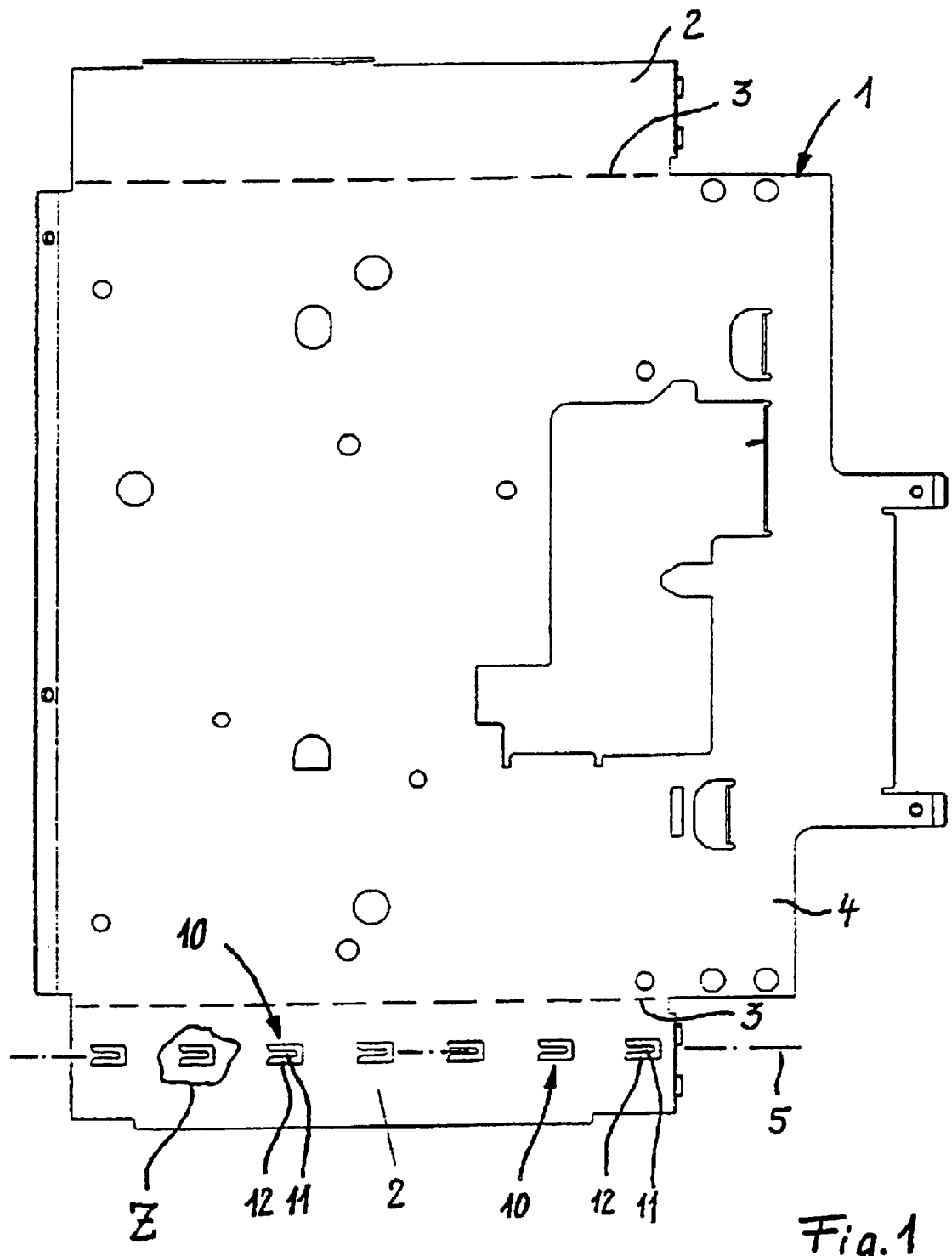
FIG. 1 a plan view onto the sheet metal of a housing part.
Figure 2:
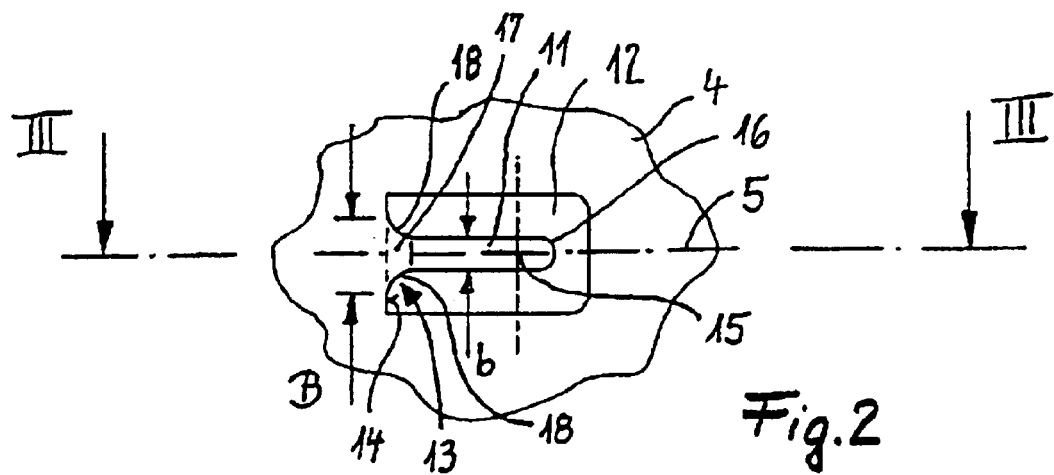
FIG. 2 the detail Z of FIG. 1 in an enlarged representation.

FIG. 1 shows schematically a plan view of a housing part 1 which, for example, comprises two sidewalls 2 which are to be erected at a right angle about folding lines 3. In one sidewall 2 contact elements 10 are arranged which are formed of sheet metal tabs 11 formed as a unitary part of the sheet metal 4 of the housing part 1. As also illustrated in FIG. 2, each sheet metal tab 11 is arranged in a window-like cutout or notch 12 which in a plan view is approximately rectangular. The sheet metal tab 11 adjoins with its base 13 the sheet metal edge 14 which is formed by the narrow side of the rectangular cutout 12. At a spacing to the base 13, a contact surface 15 is positioned which is provided at the free end 16 of the sheet metal tab 11 and is positioned at a spacing relative to the opposite narrow side of the cutout.

FIG. 2 clearly shows that the base 13 at the level of the sheet metal edge 14 has a width B which is greater than the width b of the sheet metal tab 11 measured transversely to the longitudinal center axis 5. The sheet metal tab 11 itself adjoins the sheet metal edge 14 by means of a base section 17, widening in the direction toward the sheet metal edge 14 and having a width a, wherein this base section 17, in a plan view according to FIG. 2, has approximately a basic shape of a trapezoid. In the embodiment according to FIG. 2, the side edges 18 of the base section 17 are rounded; as illustrated in FIG. 10, it may be expedient to configure the edges 18 with a linear configuration according to a trapezoid shape.

Figure 3:
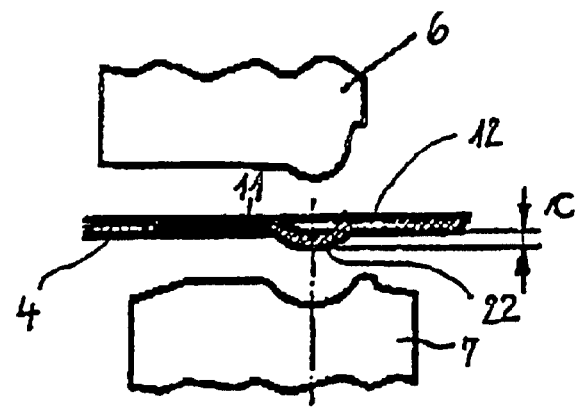
FIG. 3 a section of the sheet metal tab along the line III-III after deformation by means of stamping tools.
Figure 5:
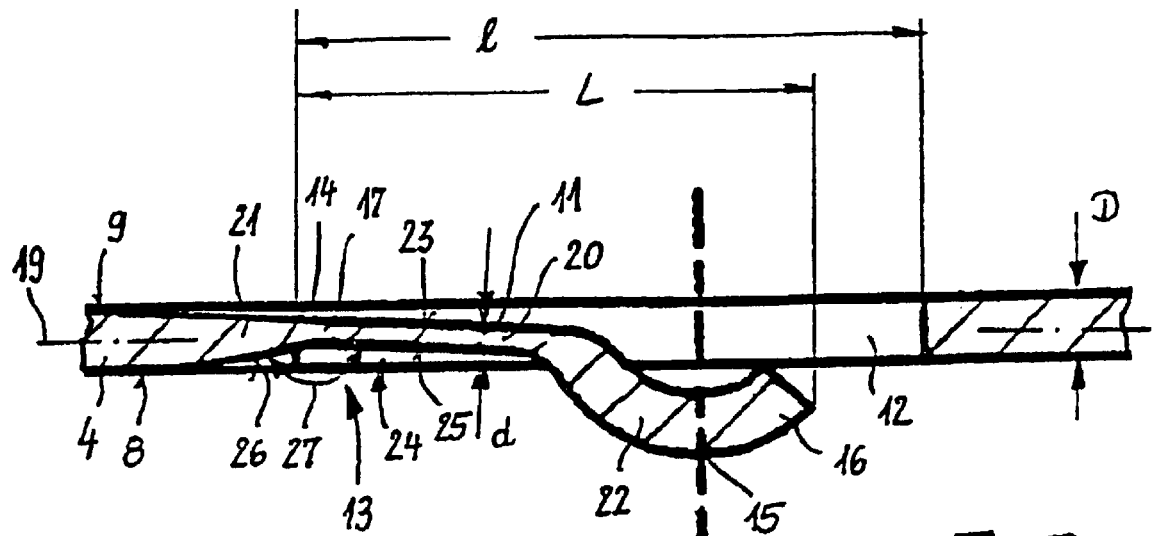
FIG. 5 a section along the line V-V of FIG. 4.

The sheet metal tab 11—as illustrated in FIG. 3—is deformed between two stamping hobs 6 and 7, whereby—as illustrated in FIG. 5—the sheet metal tab 11, in the section 20 between the sheet metal edge 14 and the contact surface 15, is reduced in its thickness d relative to the thickness D of the sheet metal 4 by cold forming. According to the invention, the cold-formed section 20 extends past the base 13 and the sheet metal edge 14 into the sheet metal 4 itself. In this connection, the end section 21 of the deformation section 20 tapering off within the sheet metal 4 can be realized by deformation of the sheet metal 4 from both side surfaces 8 and 9; in this connection, an asymmetric deformation relative to the sheet metal plane 19 can be expedient.

Figure 4:
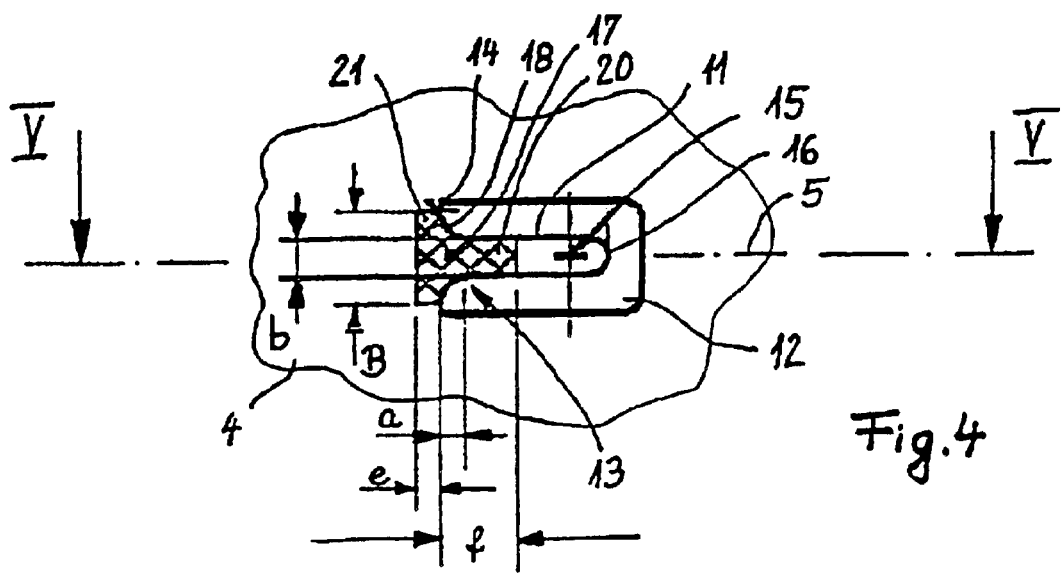
FIG. 4 a plan view according to FIG. 2 onto the deformed sheet metal tab.

Simultaneously with the deformation of the section 20 the free end 16 is formed to a contact body 22; this is realized by bending it to a semi-circular base shape in the embodiment according to FIGS. 3 through 5. The constructive embodiment is provided such that the deformation section 20 ends in front of the contact body 22, in particular, tapers off in front of the contact body 22. The sheet metal tab 11 has thus in the area of the free end 16 the material thickness D of the sheet metal 4; in the deformation section 20 adjoining the contact body 22 the material thickness is reduced by cold forming to the thickness d. In the area of the base section 17 the thickness increases again—advantageously still before the sheet metal edge 14—and has a transition via the end section 21 of the deformation section 20 into the material thickness D of the sheet metal 4. In this connection, it may be advantageous when one flat side 23 of the deformed sheet metal tab 11 is substantially of a planar configuration; in the embodiment according to FIG. 5 this is the flat side 23 of the sheet metal tab 11 facing away from the contact surface 15. The other flat side 24, which faces the contact surface 15 in the embodiment according to FIG. 5, is divided into a surface 25 in the area of the deformation section 20 and a surface 26 in the area of the end section 21 positioned within the area of the sheet metal 4. The surfaces 25 and 26 are angled at an angle 27 relative to one another, which is angle smaller than 180°.

As illustrated in FIG. 4, the cold-formed section 20 extends past the base 13 and the sheet metal edge 14 into the sheet metal 4 itself. In this connection, the base section 17 is deformed about its entire width B. It can be expedient that the end section 21 of the deformation section 20 tapering off within the sheet metal 4 is configured to be identical to, or wider than, the width B of the base 13 at the level of the sheet metal edge 14. Between the base section 13 and the contact surface 15 or the contact body 22 the sheet metal tab is embodied with the same width b.

Figure 6:
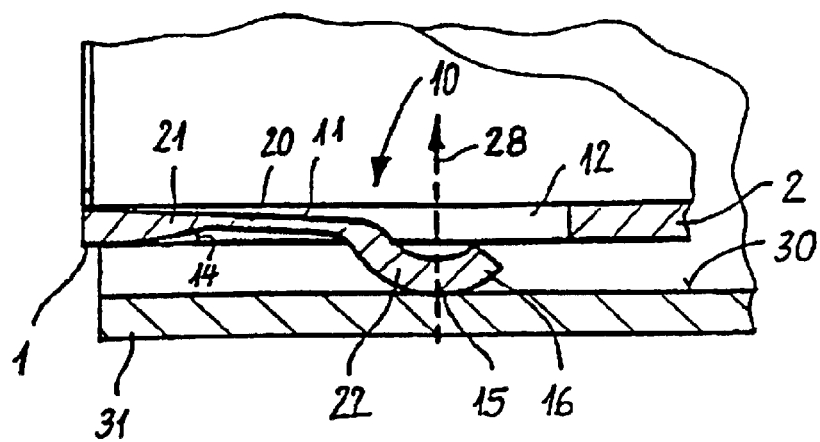
FIG. 6 a section of two housing parts which are electrically conductingly connected by means of the contact element according to the invention.

According to FIGS. 5 and 6, the deformation section 20 is angularly positioned relative to the sheet metal plane 19. Accordingly, the flat side 23 is angularly positioned relative to the sheet metal plane 19. As illustrated in FIG. 6, the position of the deformation section 20 is selected such that it is angled in the direction toward the sidewall 30 of the housing part 31 to be contacted. The contact surface 15 positioned in the direction of the longitudinal center axis 5 at a spacing to the base section 17 rests electrically conductingly against the other housing part 31, i.e., against its sidewall 30. Accordingly, the contact body 22 is pushed back in the direction of arrow 28 into the window-shaped cutout 12 wherein the deformation section 20 yields springily up to its end section 21 without being permanently deformed. In particular the base 13, which is loaded by the springy pushing back action of the sheet metal tab 11, is not subjected to permanent deformation because a sufficient elasticity is provided as a result of its greater width and the deformation beyond the base 13 into the material thickness D of the sheet metal 4. With this configuration, the length I of the cutout measured in the direction of the longitudinal center axis 5 can be kept shorter so that the weakening action on the sheet metal itself is negligible. With the configuration according to the invention, the contact elements 10 can be provided with a free length L which has sufficient springy properties when having a length of only approximately 8 mm. The length I of the cutout is then only 10 mm; it is possible to provide minimal lengths L of the sheet metal tabs 11 of approximately 5 to 6 mm with satisfactory springy properties.

In the embodiment according to FIG. 7, the basic configuration of the contact element corresponds to that of FIGS. 2 to 6 so that for same parts same reference numerals are used.

In deviation from the afore described embodiment, in FIG. 7 the end section 21 of the deformation section 20 is deformed only from the side surface 9 of the sheet metal 4, wherein the end section 21 and the deformation section 20 have a common planar flat side 23.

The end section 21 of the deformation section—as illustrated in FIG. 8—has a width V which is significantly larger than the width B of the base section 17 measured at the level of the sheet metal edge 14. The lateral edges 18 of the base section 17 are formed with a radius of roundness wherein the base section 17 has only a minimal length a, measured in the direction of the longitudinal center axis 5.

The extension e, measured in the direction of the longitudinal center axis 5, of the end section 21 of the deformation section 20 into the material of the sheet metal 4 corresponds in the embodiment according to FIGS. 7 and 8 approximately to 45 to 50% of the free length f of the deformation section 20 in the rectangular cutout 11. In the embodiment according to FIG. 4, the extension e of the end section 21 in the sheet metal 4 is approximately 35% of the free length f of the deformation section 20 in the cutout 11.

In the embodiment according to FIGS. 7 and 8, the free end 16 of the sheet metal tab 11 is angled, approximately at a right angle, and penetrates the cutout 11 wherein the free end 16 projects by a length c past the side surface 9 of the sheet metal 4. In this connection, the free end face 29 forms the contact surface.

In the embodiment according to FIGS. 9 and 10, the measured extension e of the end section 21 into the material of the sheet metal 4 is approximately 40% of the free length f of the deformation section 20 in the cutout 11. As illustrated in FIG. 10, the base section 17 is formed such that it has the precise shape of a isosceles trapezoid in a plan view. The straight lateral edges 18 from the legs while the smaller base side corresponds to the width b of the sheet metal tab 11 and the larger base side has the length B of the base 13 at the level of the sheet metal edge 14. The end section 21 of the deformation section 20 has a width in the material of the sheet metal 4 which corresponds to the width b of the base 13.

The free end 16 is angled, corresponding to the embodiment of FIG. 7, so as to extend through the recess 11, wherein, however, a slanted position relative to the sheet metal plane 19 is provided. In this way, one edge 39 of the free end face 29 provides the contact surface of the contact element 10.

What is claimed is:

1. A contact element with spring properties for contacting a first housing part with a second housing part, wherein at least the first housing part is formed of a sheet metal; the contact element comprising:

a sheet metal tab formed as a unitary part of the sheet metal of the first housing part;

wherein the sheet metal tab has a base adjoining a sheet metal edge and a contact surface positioned at a spacing from the base remote from the sheet metal edge, wherein the contact surface is configured to rest electrically conductingly against the second housing part;

wherein the sheet metal tab has a longitudinal center axis extending from the base to the contact surface;

wherein the sheet metal tab has a cold-formed section having a thickness reduced by cold forming relative to a thickness of the sheet metal; and wherein the base, at least at the level of the sheet metal edge, is wider than a width of the sheet metal tab in the area from the base to the contact surface, wherein the width is measured in a transverse direction relative to the longitudinal center axis; and wherein the cold-formed section has an end section extending past the base and the sheet metal edge in a direction away from the contact surface into the sheet metal and in the end section the thickness of the cold-formed section increases to the thickness of the sheet metal in the direction away from the contact surface.

2. The contact element according to claim 1, wherein the base is formed by a base section widening in a direction toward the sheet metal edge.

3. The contact element according to claim 2, wherein the base section in a plan view has approximately a basic shape of a trapezoid.

4. The contact element according to claim 2, wherein the base section is deformed about an entire width thereof.

5. The contact element according to claim 1, wherein the end section has a width at least identical to a width of the base.

6. The contact element according to claim 5, wherein the width of the end section is greater than the width of the base.

7. The contact element according to 5, wherein the end section has an extension, measured in a direction of the longitudinal center axis, which extension is approximately 20% to 50% of a free length of the cold-formed section measured in the direction of the longitudinal center axis away from the sheet metal edge.

8. The contact element according to claim 7, wherein the extension is 35% of the free length.

9. The contact element according to claim 5, wherein the cold-formed section ends in front of the contact surface.

10. The contact element according to claim 5, wherein a deformed flat side of the cold-formed section is planar.

11. The contact element according to claim 5, wherein the sheet metal within in the end section of the cold-formed section is deformed from both side surfaces of the sheet metal.

12. The contact element according to claim 5, wherein the width of the sheet metal tab remains identical within an area between the base section and the contact surface.

13. The contact element according to claim 1, wherein the free end of the sheet metal tab remote from the base is formed to a contact body.

14. The contact element according to claim 13, wherein the free end is angled to form the contact body.

15. The contact element according to claim 14, wherein a free end face of the free end of the sheet metal tab forms the contact surface.

16. The contact element according to claim 13, wherein the cold-formed section is cold-formed by stamping, wherein the contact body and the cold-formed section are formed simultaneously in a single stamping stroke.

17. The contact element according to claim 1, wherein the cold-formed section is cold-formed by stamping.

* * * * *